(12) United States Patent
Sun et al.

(10) Patent No.: US 9,903,904 B2
(45) Date of Patent: Feb. 27, 2018

(54) TFT DEVICE FOR MEASURING CONTACT RESISTANCE AND MEASUREMENT METHOD FOR CONTACT RESISTANCE

(71) Applicant: Shenzhen China Star Optoelectronics Technology Co., Ltd., Shenzhen, Guangdong (CN)

(72) Inventors: Bo Sun, Guangdong (CN); Xiaoling Zou, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 215 days.

(21) Appl. No.: 14/896,741

(22) PCT Filed: Oct. 8, 2015

(86) PCT No.: PCT/CN2015/091441
§ 371 (c)(1),
(2) Date: Dec. 8, 2015

(87) PCT Pub. No.: WO2017/054251
PCT Pub. Date: Apr. 6, 2017

(65) Prior Publication Data
US 2017/0089973 A1    Mar. 30, 2017

(30) Foreign Application Priority Data
Sep. 28, 2015 (CN) .......................... 2015 1 0629332

(51) Int. Cl.
*G01R 31/02* (2006.01)
*G01R 31/26* (2014.01)
(Continued)

(52) U.S. Cl.
CPC ...... *G01R 31/2607* (2013.01); *H01L 51/0031* (2013.01); *H01L 51/0545* (2013.01);
(Continued)

(58) Field of Classification Search
CPC ........... H01L 21/32053; H01L 21/0485; H01L 29/66068; G01R 31/2635; G09G 3/006; G09G 3/3233; G09G 2330/12
(Continued)

(56) References Cited

U.S. PATENT DOCUMENTS

| 4,100,486 A * | 7/1978 | Casowitz ........... G01R 31/2637 257/E21.531 |
| 7,030,633 B1 * | 4/2006 | Qiu ...................... G01N 27/045 257/E21.531 |
| 2013/0341646 A1 * | 12/2013 | Yamada ............ H01L 21/32053 257/77 |

* cited by examiner

*Primary Examiner* — Tung X Nguyen
(74) *Attorney, Agent, or Firm* — Andrew C. Cheng

(57) ABSTRACT

TFT device for measuring a contact resistance and measurement method for a contact resistance are disclosed. The TFT includes an active layer, a gate electrode and a gate insulation layer. The active layer includes a channel and at least three doping regions, wherein, two of the at least three doping regions is connected through a channel, when measuring the contact resistance, using two of the at least three doping regions as testing points for measuring. The gate electrode disposed correspondingly to the channel. The gate insulation layer for insulating the active layer from the gate electrode. The uniformity of the present invention is well, the manufacturing process, the film forming quality and the interface property are similar in a maximum degree. Accordingly, a measurement accuracy is increased, saving the distribution region at the same time, increasing the utilization of the experimental region.

4 Claims, 4 Drawing Sheets

(51) Int. Cl.
*H01L 51/05* (2006.01)
*H01L 51/10* (2006.01)
*H01L 51/00* (2006.01)

(52) U.S. Cl.
CPC ...... *H01L 51/0558* (2013.01); *H01L 51/0566* (2013.01); *H01L 51/105* (2013.01)

(58) Field of Classification Search
USPC .......................................................... 257/77
See application file for complete search history.

TFT DEVICE FOR MEASURING CONTACT RESISTANCE AND MEASUREMENT METHOD FOR CONTACT RESISTANCE

BACKGROUND OF THE INVENTION

1. Field of the Invention

The present invention relates to a thin-film-transistor (TFT) technology field, and more particularly to a TFT device for measuring a contact resistance and measurement method for a contact resistance.

2. Description of Related Art

A Thin-Film-Transistor (TFT) is widely applied in a semiconductor industry, a display industry, a transducer industry and a chip industry. The research for the field effect transistor mainly includes stability and functionality.

A TFT is a triode, which includes a gate electrode, a source electrode and a drain electrode. When a gate voltage is greater than a threshold voltage (Vth), an active layer generates a carrier gathering and an energy band bending under the function of the gate voltage in order to form a conductive channel. At this time, when a non-zero voltage is applied between the source electrode and the drain electrode, the carrier can move in a predetermined direction in the conductive channel under the function of the non-zero voltage in order to form a current. The above is the basic operation principle of the TFT device.

According to a physics formula: I=U/R, when a voltage is fixed, the resistance is greater, and the current is smaller. In the research of the TFT device, how to obtain a conduction current having a greater current under a lower Vds is always a key problem. To achieve the above purpose, decreasing a resistance between the source electrode and the drain electrode as many as possible is required. Because the source electrode and the drain electrode are made of a metal material generally, and a semiconductor material is generally a non-metal material, an interface between the source electrode and a semiconductor and an interface between the drain electrode and the semiconductor exist a contact resistance. The contact resistance is decided based on a treatment for the interface and a difference in energy functions of a metal material and a semiconductor material. Accordingly, the mechanisms of a channel resistance and the contact resistance are different. In a research, the channel resistance and the contact resistance are studied separately. However, when a TFT device is finished, the channel resistance and the contact resistance are integrated, according to an I-V (current-voltage) curve, a sum of the channel resistance and the contact resistance is obtained:

$$R_{Total}=R_C+R_L,\ R_L=kL\ (k \text{ is a constant})\ R_{total}=Rc+kL=V_{ds}/I_{ds}$$

Wherein, $R_C$ is the contact resistance, $R_L$ is the channel resistance, L is a length of the channel of the TFT. Utilizing the above formula, measuring TFT devices having different L, and finally, drawing a $R_{Total}$-L diagram, an intercept on a vertical axis of a straight line is the $R_C$ (as shown in FIG. 1). The above method is called a TLM (The Transmission Line Modeling Method) method.

In the conventional art, when utilizing the TLM method to obtain the contact resistance, multiple TFT devices having different lengths (L) have to be manufactured (as shown in FIG. 2). Therefore, a uniformity for manufacturing the TFT devices will affect the final result. A distribution region of the TFT devices is larger, an occupied experimental region is larger, and a utilization of the experimental region is lower. Manufacturing multiple TFT devices relates to an affection of the interface status and the repeatability of the manufacturing process.

SUMMARY OF THE INVENTION

The present invention provides a TFT device for measuring a contact resistance and measurement method for a contact resistance, which can solve a poor uniformity and inaccurate measurement result problem because of using multiple TFT devices for measuring in the conventional art.

In order to solve the above technology problem, a technology solution adopted by the present invention is: a thin-film-transistor (TFT) used for measuring a contact resistance, comprising: an active layer including a channel and four doping regions, wherein, two of the four doping regions is connected through a channel, when measuring the contact resistance, using two of the four doping regions as testing points for measuring, the active layer is made of an organic semiconductor material, each doping region is a N-type doping region or a P-type doping region formed by an ion implantation method; a gate electrode disposed corresponding to the channel; and a gate insulation layer for insulating the active layer from the gate electrode.

Wherein, each of the doping regions is an electrode of the TFT, a distance between two electrodes of the TFT is a channel length.

Wherein, two of the four doping regions are located at two terminals of the active layer.

Wherein, a channel length between each two adjacent doping regions is different.

In order to solve above technology problem, another technology solution adopted by the present invention is: a thin-film-transistor (TFT) used for measuring a contact resistance, comprising: an active layer including a channel and at least three doping regions, wherein, two of the at least three doping regions is connected through a channel, when measuring the contact resistance, using two of the at least three doping regions as testing points for measuring; a gate electrode disposed corresponding to the channel; and a gate insulation layer for insulating the active layer from the gate electrode.

Wherein, each of the doping regions is an electrode of the TFT, a distance between two electrodes of the TFT is a channel length.

Wherein, two of the at least three doping regions are located at two terminals of the active layer.

Wherein, the at least three doping regions of the active layer includes four doping regions.

Wherein, a channel length between each two adjacent doping regions is different.

Wherein, the active layer is made of an organic semiconductor material, each doping region is an N-type doping region or a P-type doping region.

In order to solve above technology problem, another technology solution adopted by the present invention is: a measurement method for a contact resistance of a thin-film-transistor (TFT), comprising following steps: providing a TFT having multiple channels and at least three doping regions on an active layer of the TFT, wherein, two of the at least three doping regions are connected through one of the multiple channels, and using two of the at least three doping regions as two testing points for measuring in order to obtain a total resistance between the two testing points; changing the two testing points in order to change a channel length on the TFT, measuring and obtaining a total resistance between two testing points after changing, wherein, the channel length is a distance between two doping regions; and drawing a relationship diagram of a channel length and a total resistance according to at least two measurement data, and obtaining a contact resistance according to the relationship diagram.

Wherein, in the step of using two of the at least three doping regions as two testing points for measuring in order to obtain a total resistance between the two testing points, a voltage value and a current value between the two testing points are measured, through a formula: $R_{total}=V_{ds}/I_{ds}$ to obtain the total resistance, wherein, $R_{total}$ is the total resistance, $V_{ds}$ is the voltage value between the two testing points, and $I_{ds}$ is the current value between the two testing points.

Wherein, the step of changing the two testing points in order to change a channel length on the TFT, measuring and obtaining a total resistance between two testing points after changing means changing one of the two testing points or simultaneously changing the two testing points.

Wherein, in the step of drawing a relationship diagram of a channel length and a total resistance according to at least two measurement data, and obtaining a contact resistance according to the relationship diagram, drawing the relationship diagram according to a formula: $R_{total}=R_C+R_L$ and $R_L=kL$, wherein, $R_C$ is the contact resistance, $R_L$ is a channel resistance, k is a constant and L is the channel length.

The beneficial effects of the present invention are: comparing with the conventional art, through disposing at least three doping regions on the active layer of the TFT, when measuring a contact resistance, selecting two of the at least three doping regions as test points to form a testing group to perform measuring, and through selecting different testing groups to change the channel length so that multiple total resistances under different channel lengths can be measured, and obtaining multiple measurement data on one TFT device can be realized such that manufacturing multiple TFT devices is not required. The present invention maximally integrates devices having different channel lengths at a same location in one TFT so that the uniformity is well, the manufacturing process, the film forming quality and the interface property are similar in a maximum degree. Accordingly, a measurement accuracy is increased, saving the distribution region at the same time, increasing the utilization of the experimental region.

DETAILED DESCRIPTION OF THE PREFERRED EMBODIMENT

The following content combines figures and embodiments for detail description of the present invention.

Figure 3:
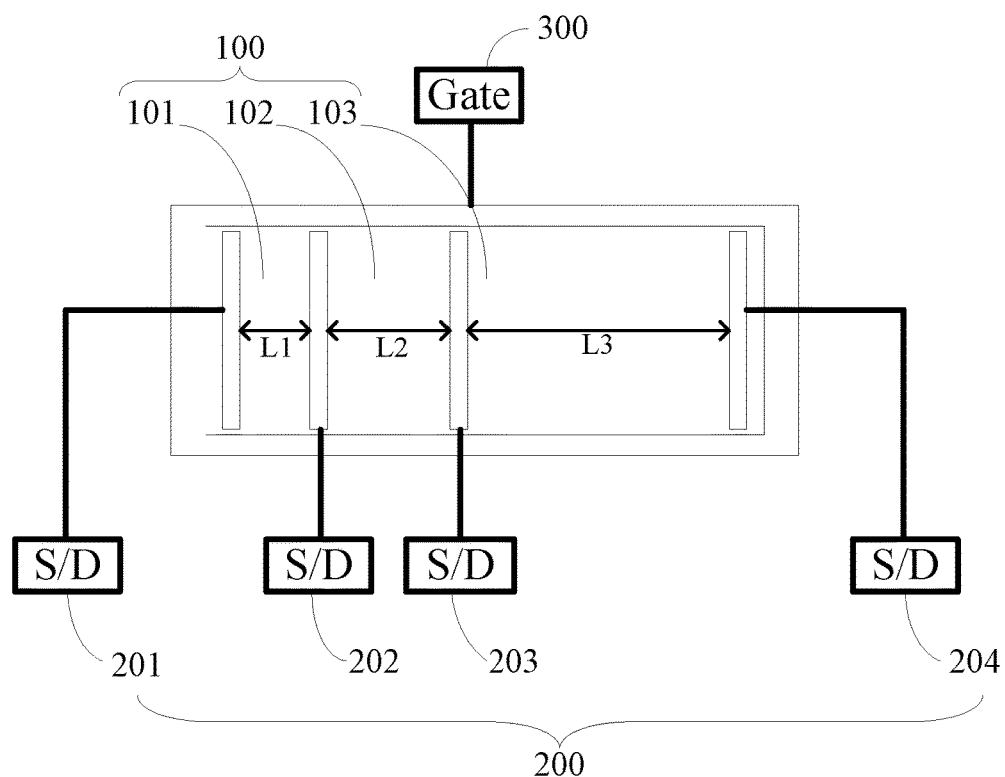
FIG. 3 is a top view of a TFT device for measuring a contact resistance according to an embodiment of the present invention.
Figure 4:
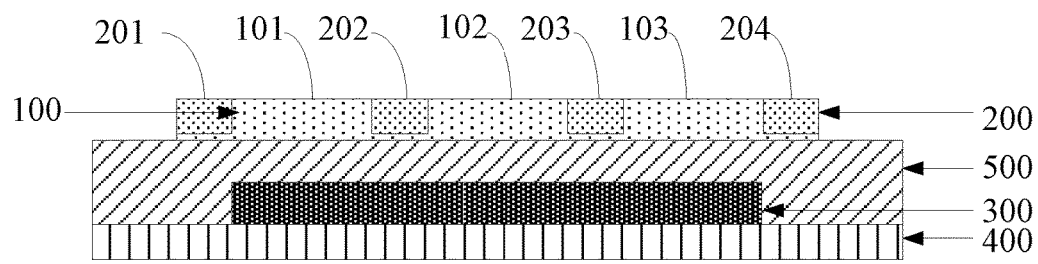
FIG. 4 is a schematic lamellar structure diagram of a cross section of a TFT device for measuring a contact resistance according to an embodiment of the present invention.

With reference to FIG. 3 and FIG. 4, FIG. 3 is a top view of a TFT device for measuring a contact resistance according to an embodiment of the present invention; and FIG. 4 is a schematic lamellar structure diagram of a cross section of a TFT device for measuring a contact resistance according to an embodiment of the present invention.

The present invention provides a TFT for measuring a contact resistance. The TFT includes an active layer, a gate electrode 300 and a gate insulation layer 500.

Wherein, the active layer is provided with a channel 100 and at least three doping regions 200. Two doping regions 200 are connected through the channel 100. When measuring a contact resistance, using two of the at least three doping regions 200 as testing points.

The gate electrode 300 is disposed correspondingly to the channel 100.

The gate insulation layer 500 is used for insulating the active layer and the gate electrode 300.

Figure 1:
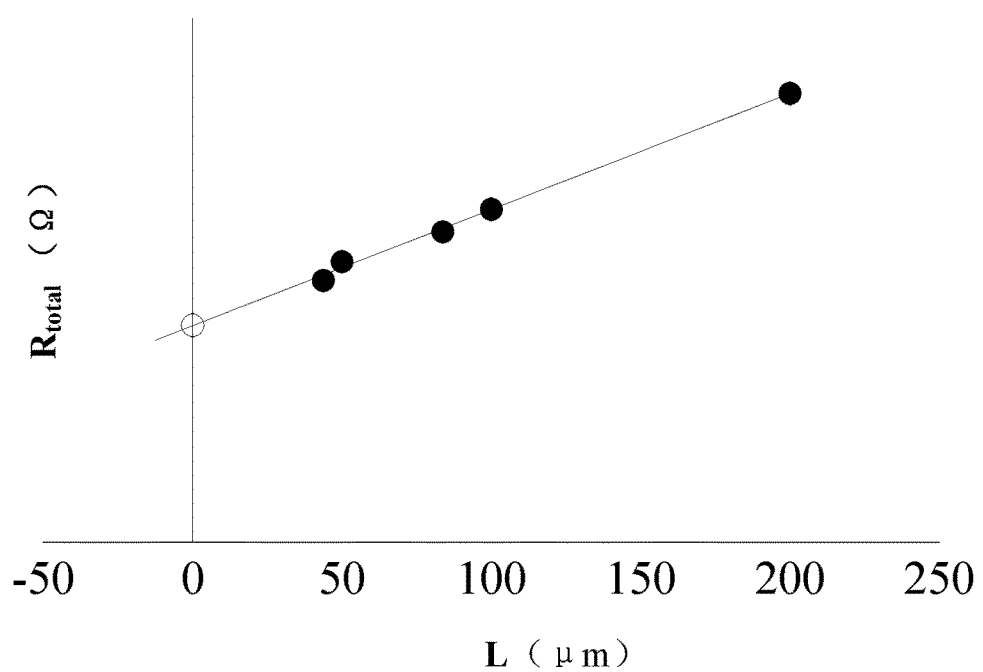
FIG. 1 is a relationship diagram between a sum of a contact resistance and a channel resistance and a channel length.
Figure 2:
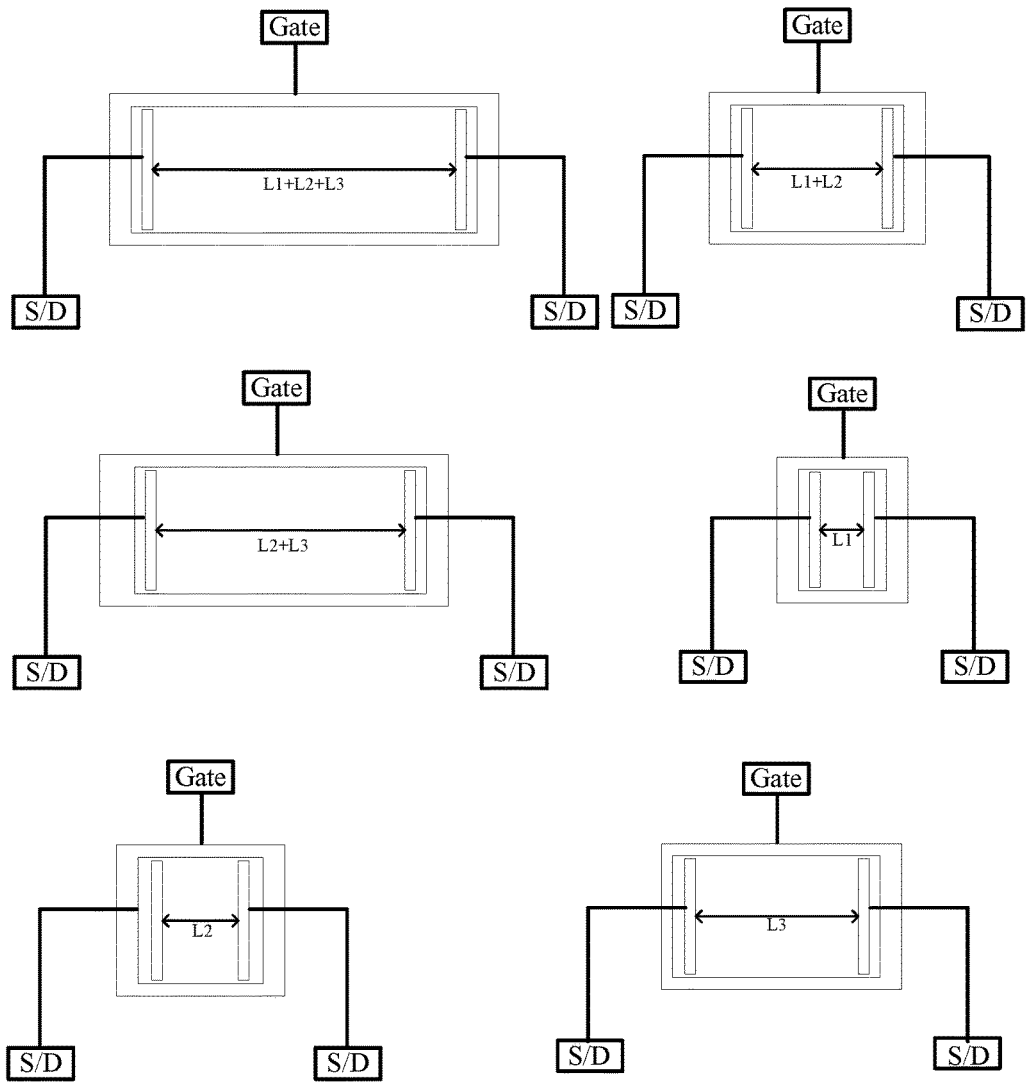
FIG. 2 is a schematic diagram of a TFT device for measuring a contact resistance in the conventional art.

When measuring a contact resistance, selecting two testing points as a testing group to perform measuring in order to obtain a total resistance between the two testing points. Then, changing testing points in order to change a channel length between two new testing points to perform measuring. As a result, different total resistances corresponding to different channel lengths are obtained. Through obtaining the total resistances of at least two channel lengths, a straight line as shown in FIG. 1 can be obtained. According to an intersection point of the straight line and the vertical axis in the figure, a value of the contact resistance can be obtained. Of course, when the testing groups for measuring is more, the data obtained is more so that the value of the contact resistance is more precise.

Comparing with the conventional art, through disposing at least three doping regions on the active layer of the TFT, when measuring a contact resistance, selecting two of the at least three doping regions as test points to form a testing group to perform measuring, and through selecting different testing groups to change the channel length so that multiple total resistances under different channel lengths can be measured, and obtaining multiple measurement data on one TFT device can be realized such that manufacturing multiple TFT devices is not required. The present invention maximally integrates devices having different channel lengths at a same location in one TFT so that the uniformity is well, the manufacturing process, the film forming quality and the interface property are similar in a maximum degree. Accordingly, a measurement accuracy is increased, saving the distribution region at the same time, increasing the utilization of the experimental region.

With continuously referring to FIG. 1 and FIG. 4, a TFT of the present embodiment includes a substrate 400, a gate electrode 300, a gate insulation layer 500 and an active layer.

Wherein, the substrate 400 is a glass substrate, and the glass substrate has a good thermal stability in order to maintain a stable property after several high temperature processes. Because many chemical substances are used in a TFT manufacturing process, the glass substrate requires a good chemical resistance property. The glass substrate also requires enough mechanical strength, a good precision machining property and a good electrical insulation property.

The gate electrode 300 is disposed on a buffering layer. The gate electrode 300 is disposed corresponding to the channel 100. The gate electrode 300 is usually made by an aluminum material or an aluminum alloy material.

The gate insulation layer 500 is covered on the gate electrode 300. The gate insulation layer 500 can be one layer. The gate insulation layer 500 can be a SiO layer, a SiN layer or an AlO layer. A thickness of the gate insulation layer 500 ranges from 175 nm to 300 nm. In another embodiment, the gate insulation layer 500 can be two layers. A first layer of the two layers is a $SiO_2$ film. In order to improve the quality of the $SiO_2$ film, a second layer of $SiN_x$ can be added on the $SiO_2$ film.

The active layer includes a channel 100 and at least one doping region 200. Wherein, the channel 100 is made of an organic semiconductor material on the gate insulation layer 500. Then, through an ion implantation method, the doping region 200 is formed on the channel 100. The doping region 200 is an electrode of the TFT, that is, a source electrode or a drain electrode. A distance between two electrodes is a channel length. The doping region 200 can be an N-type doping region or a P-type doping region.

The number of the at least one doping region 200 of the present embodiment is four. The four doping regions 200 are alternately disposed on the channel 100. Two of the four doping regions 200 are disposed at two terminals of the active layer. The other two of the four doping regions 200 are disposed at a middle portion of the active layer. In the present embodiment, a channel length between each two adjacent doping regions 200 is different.

It should be noted that in another embodiment, a channel length between each two adjacent doping regions 200 can be the same, or a channel length between at least two adjacent doping regions 200 is different. The only requirement is that obtaining two different channel lengths when selecting different testing groups can be realized.

For example, the four doping regions 200 of the present embodiment are respectively a doping region 201, a doping region 202, a doping region 203 and a doping region 204. The four doping regions 200 are alternately disposed on the channel 100. Wherein, the doping region 201 and the doping region 204 are respectively disposed at two terminals of the active layer. The doping region 202 and the doping region 203 are disposed at the middle portion of the active layer. Wherein, a channel length between the doping region 201 and the doping region 202 is a length of a channel 101, and a channel length between the doping region 202 and the doping region 203 is a length of a channel 102, and a channel length between the doping region 203 and the doping region 204 is a length of a channel 103. As shown in FIG. 3, lengths of the channel 101, the channel 102 and the channel 103 are respectively L1, L2 and L3. Besides, in the present embodiment, L1≠L2≠L3.

When performing measuring in the present embodiment, the testing groups which can be selected are:

(1) the doping region 201 and the doping region 202, the channel length is L1.
(2) the doping region 201 and the doping region 203, the channel length is L1+L2.
(3) the doping region 201 and the doping region 204, the channel length is L1+L2+L3.
(4) the doping region 202 and the doping region 203, the channel length is L2.
(5) the doping region 202 and the doping region 204, the channel length is L2+L3.
(6) the doping region 203 and the doping region 204, the channel length is L3.

When measuring the contact resistance, through measuring total resistances of at least two testing groups of the above testing groups, for example, measuring total resistances of the six testing groups above, a straight line representing a relationship between the channel lengths and the total resistances can be drawn precisely in order to obtain the contact resistance.

In the present embodiment, one TFT can obtain measurement data of six TFTs.

Of course, when the testing groups are more, the measurement data are more. The straight line representing a relationship between the channel lengths and the total resistances is more precise. The number of the doping regions 200 of the present invention is four or more. When the number of the doping regions 200 is four, the number of the measurement data is fully complied with the TLM method. When the number of the doping regions 200 is five, ten testing groups can be obtained. In an actual design, the number of the testing points can be determined according to different data requirement, that is, the number of the doping regions 200. The TFT device as provided by the present invention can maximally integrate devices having different channel lengths at a same location in one TFT so that the uniformity is well, the manufacturing process, the film forming quality and the interface property are similar in a maximum degree. Accordingly, a measurement accuracy is increased, saving the distribution region at the same time, increasing the utilization of the test region.

It should be noted that the TFT of the present embodiment cannot only be a sample for measuring a contact resistance of the above method, but also a sample for measuring a contact resistance of the other method. For example, a four-probe method. Accordingly, through different methods, the measurement result can be confirmed in order to guarantee the credibility of the data.

The TFT of the present embodiment is a bottom-gate electrode TFT. The gate electrode 300 is disposed below the channel 100. It should be noted that the present invention can also be applied to a top-gate electrode TFT.

Figure 5:
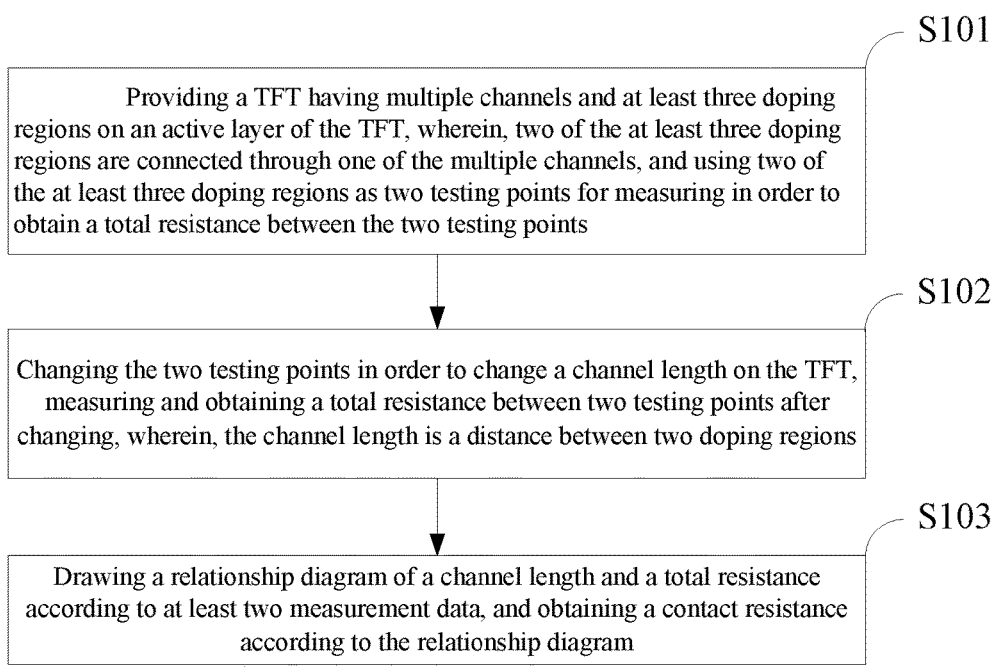
FIG. 5 is a flow chart of a measurement method for a contact resistance according to the present invention.

With reference to FIG. 5, and FIG. 5 is a flow chart of a measuring method for a contact resistance according to the present invention.

The measurement method for a contact resistance provided by the present invention including following steps:

Step S101: providing a TFT having multiple channels and at least three doping regions on an active layer of the TFT, wherein, two of the at least three doping regions are connected through one of the multiple channels, and using two of the at least three doping regions as two testing points for measuring in order to obtain a total resistance between the two testing points.

Specifically, in the step S101, after selecting the two testing points, a voltage value and a current value between the two testing points are measured. Through a formula: $R_{total}=V_{ds}/I_{ds}$ to obtain the total resistance. Wherein, the $R_{total}$ is the total resistance, $V_{ds}$ is the voltage value between the two testing points, and $I_{ds}$ is the current value between the two testing points.

For example, with combined reference to FIG. 3, selecting a doping region 201 and a doping region 202 as testing points for measuring. At this time, the measured total resistance $R_{total1}$ is a sum of a contact resistance and a channel resistance when a channel length is L1.

Step S102: changing the two testing points in order to change a channel length on the TFT, measuring and obtaining a total resistance between two testing points after changing, wherein, the channel length is a distance between two doping regions.

In the step S102, changing the two testing points is changing one of the two testing points or simultaneously changing the two testing points. The only requirement is to change the channel length.

For example, with combined reference to FIG. 3, selecting a doping region 201 and a doping region 203 as testing points for measuring. At this time, a measured total resistance $R_{total2}$ is a sum of the contact resistance and a channel resistance when the channel length is L1+L2.

It should be noted that when the measurement data is more, the measurement result is more precise. For example, the present embodiment can further measure a total resistance between the doping region 201 and a doping region 204. At this time, a measured total resistance $R_{total3}$ is a sum of the contact resistance and a channel resistance when a channel length is L1+L2+L3.

In addition, the doping region 202 and the doping region 203, and/or the doping region 202, and the doping region 204, and/or the doping region 203 and the doping region 204 can be selected so that six groups of data can be measured.

Step S103: drawing a relationship diagram of a channel length and a total resistance according to at least two measurement data, and obtaining a contact resistance according to the relationship diagram.

Specifically, the relationship diagram of a channel length and a total resistance is drawn according to a following formula: $R_{total}=R_C+R_L$ and $R_L=kL$. Wherein, $R_C$ is the contact resistance, $R_L$ is a channel resistance, k is a constant and L is the channel length. From the formula, when L=0, $R_L=0$, at this time $R_{total}=R_C$.

For example, in the relationship diagram of channel length and total resistance, the channel length is a horizontal axis, the total resistance is a vertical axis. When selecting the doping region 201 and the doping region 202 as a testing group, the value of $R_{total1}$ can be obtained by a formula: $R_{total}=V_{ds}/I_{ds}$ so that a point (L1, $R_{total1}$) in the relationship diagram of channel length and total resistance. Similarly, when selecting the doping region 201 and the doping region 203 as a testing group, a point (L1+L2, $R_{total2}$) can be drawn. The two points can determined a straight line of the channel length and the total resistance. An intersection point ($L_0$, $R_{total0}$) formed by the straight line and the vertical axis is the total resistance when the channel length $L_0$=0, that is, the contact resistance $R_C$.

Drawing two points can determine the straight line of the total resistance and the channel length. Of course, when the points are more, the straight line is more precise.

For example, the present embodiment can also draw points of (L1+L2+L3, $R_{total3}$), (L2, $R_{total4}$), (L2+L3, $R_{total5}$), and (L3, $R_{total6}$) to obtain six points totally. According to the six points to draw a straight line of a relationship of a total resistance and a channel length, a value of an intersection point of the straight line and a vertical axis is a value of a contact resistance.

The present invention can obtain multiple measurement data on one TFT device such that manufacturing multiple TFT devices is not required. Because the present invention maximally integrates devices having different channel lengths at a same location in one TFT, the uniformity is well, the manufacturing process, the film forming quality and the interface property are similar in a maximum degree. Accordingly, a measurement accuracy is increased.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A measurement method for a contact resistance of a thin-film-transistor (TFT), comprising following steps:
   providing a TFT having multiple channels and at least three doping regions on an active layer of the TFT, wherein, two of the at least three doping regions are connected through one of the multiple channels, and using two of the at least three doping regions as two testing points for measuring in order to obtain a total resistance between the two testing points;
   changing the two testing points in order to change a channel length on the TFT, measuring and obtaining a total resistance between two testing points after changing, wherein, the channel length is a distance between two doping regions; and
   drawing a relationship diagram of a channel length and a total resistance according to at least two measurement data, and obtaining a contact resistance according to the relationship diagram.

2. The measurement method according to claim 1, wherein, in the step of using two of the at least three doping regions as two testing points for measuring in order to obtain a total resistance between the two testing points, a voltage value and a current value between the two testing points are measured, through a formula: Rtotal=Vds/Ids to obtain the total resistance, wherein, Rtotal is the total resistance, Vds is the voltage value between the two testing points, and Ids is the current value between the two testing points.

3. The measurement method according to claim 2, wherein, the step of changing the two testing points in order to change a channel length on the TFT, measuring and obtaining a total resistance between two testing points after changing means changing one of the two testing points or simultaneously changing the two testing points.

4. The measurement method according to claim 3, wherein, in the step of drawing a relationship diagram of a channel length and a total resistance according to at least two measurement data, and obtaining a contact resistance according to the relationship diagram, drawing the relationship diagram according to a formula: Rtotal=$R_C+R_L$ and $R_L$=kL, wherein, $R_C$ is the contact resistance, $R_L$ is a channel resistance, k is a constant and L is the channel length.

* * * * *